United States Patent [19]
Kasai

[11] Patent Number: 6,034,384
[45] Date of Patent: Mar. 7, 2000

[54] SEMICONDUCTOR MEMORY DEVICE HAVING MEMORY CELLS SIMILARLY LAYOUTED AND PERIPHERAL CIRCUITS SYMMETRICALLY LAYOUTED IN MEMORY CELL ARRAYS

[75] Inventor: Naoki Kasai, Tokyo, Japan

[73] Assignee: NEC Corporation, Tokyo, Japan

[21] Appl. No.: 09/081,653

[22] Filed: May 20, 1998

[30] Foreign Application Priority Data

May 28, 1997 [JP] Japan .................................. 9-138601

[51] Int. Cl.[7] .................................................. H07L 27/108
[52] U.S. Cl. ............................................ 257/206; 257/390
[58] Field of Search ........................... 257/202–211, 390

[56] References Cited

U.S. PATENT DOCUMENTS

| | | | |
|---|---|---|---|
| 4,668,972 | 5/1987 | Sato et al. ................................ | 257/369 |
| 5,367,187 | 11/1994 | Yuen ....................................... | 257/206 |
| 5,422,581 | 6/1995 | Mahant-Shetti et al. ............... | 257/206 |
| 5,581,202 | 12/1996 | Yano et al. .............................. | 257/206 |
| 5,591,995 | 1/1997 | Shaw ....................................... | 257/206 |
| 5,698,873 | 12/1997 | Colwell et al. ......................... | 257/206 |

OTHER PUBLICATIONS

Takanori Saeki et al., "A 2.5ns Clock Access 250MHz 256Mb SDRAM With a Synchronous Mirror Delay", IEEE International Solid–State Circuits Conference, 1996, pp. 374–375.

*Primary Examiner*—David B. Hardy
*Attorney, Agent, or Firm*—Young & Thompson

[57] ABSTRACT

A semiconductor dynamic random access memory device includes plural memory cell arrays arranged in two columns, and the memory cell arrays of one column has memory cell sub-arrays and peripheral circuits such as sense amplifiers and sub-word line drivers arranged around the memory cell sub-arrays; the memory cells of the sub-arrays are arranged in a first pattern, and the peripheral circuits of adjacent sub-arrays are arranged in symmetry with respect to a line of symmetry perpendicular to the direction of the columns so as to increase a margin of alignment without sacrifice of simplicity of design work.

14 Claims, 10 Drawing Sheets

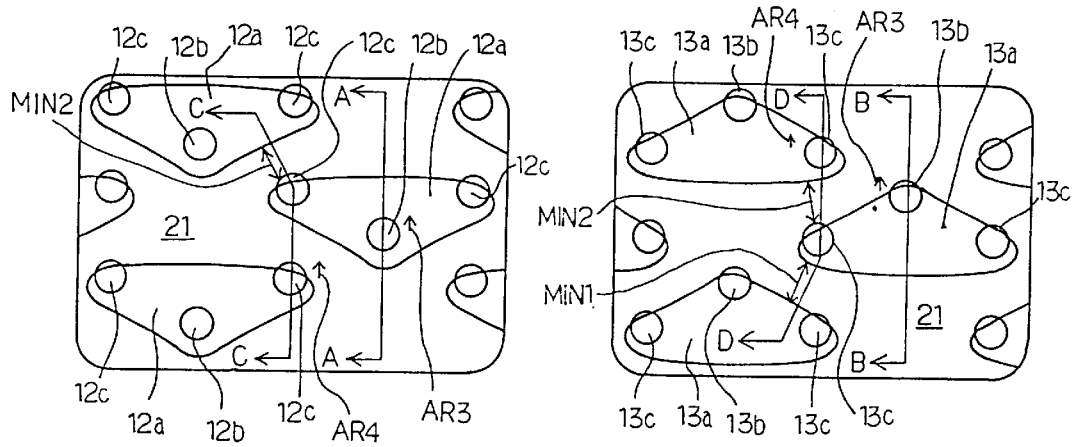
Fig. 2A
PRIOR ART
Fig. 2B
PRIOR ART
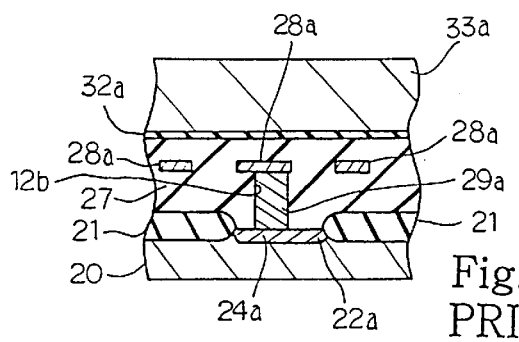
Fig. 3A
PRIOR ART
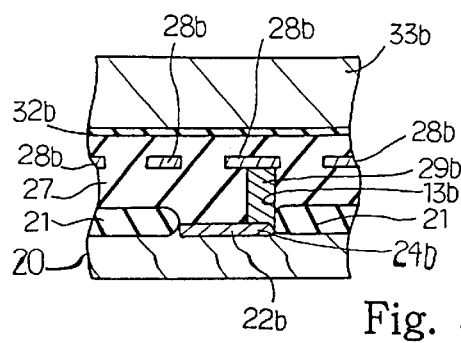
Fig. 3B
PRIOR ART

SEMICONDUCTOR MEMORY DEVICE HAVING MEMORY CELLS SIMILARLY LAYOUTED AND PERIPHERAL CIRCUITS SYMMETRICALLY LAYOUTED IN MEMORY CELL ARRAYS

FIELD OF THE INVENTION

This invention relates to a semiconductor memory device and, more particularly, to a layout of a semiconductor memory device having memory cells similarly layouted in plural memory cell arrays and peripheral circuits symmetrically layouted in the plural memory cell arrays.

DESCRIPTION OF THE RELATED ART

A semiconductor memory device is a typical example of the ultra large scale integration. Semiconductor manufacturers have increased the memory density at annual rate of 1.6, and the increase of integration density is achieved by reducing the minimum pattern width and increasing the semiconductor chip size. The minimum pattern width of the present generation is reduced to two third of the previous generation, and the chip size is one and half times larger than the previous semiconductor chip.

The semiconductor memory device is broken down to a data storage, an addressing system, a data amplifier, a controller and an input and output circuit. Plural memory cells are arranged in two-dimensional matrix, and the memory capacity is proportional to the number of memory cells. The memory cell array occupies the widest area on the semiconductor chip, and it is necessary to reduce the real estate occupied by each memory cell in order to increase the memory capacity. For this reason, the memory cells are designed with the minimum pattern width, and the margin of alignment between patterns is minimized.

When a small number of memory cells formed the data storage, they were arranged in a single array. A large number of memory cells presently serve as the data storage, and the data storage is divided into plural arrays. The plural arrays are advantageous over a single array, because the access speed is surely improved. When the memory capacity is increased, the number of memory cells coupled to each bit line is increased, and, accordingly, the bit lines are prolonged. Moreover, the bit lines are narrowed under the reduction of the minimum design rule. As a result, an electric signal representative of a data bit is required to travel along the long bit line against the large resistance, and consumes long time. The plural memory cell arrays make the bit lines short, and improve the signal propagation speed.

A typical example of the semiconductor memory device is disclosed by T. Saeki et. al. in "A 2.5 ns Clock Access 250 MHz SDRAM with a Synchronous Mirror Delay", 1996 IEEE International Solid-State Circuits Conference, pages 374 to 375. FIG. 1 illustrates the layout of memory cell arrays and the peripheral circuits of the prior art semiconductor dynamic random access memory device. The prior art semiconductor dynamic random access memory device is fabricated on a rectangular semiconductor chip 1, and the semiconiductor chip has long edges in a longitudinal direction indicated by arrow AR1 and short edges in a lateral direction indicated by arrow AR2. A narrow area 2 extends in the longitudinal direction AR1, and occupies a central portion of the semiconductor chip 1. The narrow area 2 is assigned to the controller and the input and output circuit. Two narrow areas 3/4 extend along both sides of the narrow area 2 in the longitudinal direction AR1, and are assigned to column address decoders. Narrow areas 5/6 extend in the lateral direction AR2, and are spaced from each other. The narrow areas 5/6 are assigned to row address decoders.

The narrow areas 2/3/4/5/6 divide the real estate of the semiconductor chip 1 into eight sections, and are assigned to eight memory cell arrays 7a, 7b, 7c, 7d, 7e, 7f, 7g and 7h, respectively. The memory cell arrays 7a to 7d are located on the left side of the narrow area 3, and the other memory cell arrays 7e to 7h are located on the right side of the narrow area 4. A certain pattern is repeated in the memory cell arrays 7a to 7h, and is represented by "F". The pattern F in the memory cell arrays 7f/7h is assumed to be standard, the pattern F of the memory cell arrays 7b/7d is symmetrical with respect to a line SY1 of symmetry. On the other hand, the pattern F of each memory cell array 7e/7g is symmetrical with respect to a line SY2/SY3 of symmetry, and the pattern F of each memory cell array 7a/7c turns at 180 degrees around a point P1/P2 of symmetry.

The symmetrical patterns F make the layout design on the semiconductor chip 1 simple. For example, when a designer layouts the connection between the column address decoder and the memory cell array 7f, he simply inverts the layout with respect to the line of symmetry SY1 for the connection between the column address decoder and the memory cell array 7b. The inversion is easy by using a CAD (Computer Aided Design) system. Moreover, when the standard pattern F is modified, the CAD system automatically corrects the pattern of the other symmetrical memory cell array 7b. Thus, the symmetrical pattern reduces the layout design work to half of the full layout design.

A part of the memory cell array 7h and a corresponding part of the memory cell array 7g are enlarged in boxes BX1/BX2, respectively. The memory cell array 7g/7h includes memory cell sub-arrays 8a/9a, and sense amplifier units 8b/9b located along side lines of the memory cell sub-array 8a/9a, sub-word line drivers 8c/9c located along end lines of the memory cell sub-array 8a/9a and crossing areas 8d/9d. Plural memory cells are arranged in two-dimensional matrix in the memory cell sub-array 8a/9a, and the layout of the sense amplifier unit 8b/9b crosses the layout of the sub-word line driver 8c/9c in the crossing, areas 8d/9d. The memory cells have a COB (Capacitor Over Bit-line) structure.

Three kinds of mask pattern are indicated in for the memory cell sub-arrays 8a/9a, and are enlarged in boxes BX3 and BX4, respectively. The three kinds of mask pattern are a mask pattern for active areas, a mask pattern for node contact holes and a mask pattern for bit contact holes, and are aligned with one another as shown. Although other masks participate the formation of the memory cell sub-arrays 8a/9b, they are deleted from the boxes BX3/BX4. The other masks are used for word lines, bit lines, storage nodes and counter electrodes.

The mask pattern 10a for the active areas in the memory cell sub-array 8a have a T-letter configuration, and the mask pattern 10b for the active areas in the memory cell sub-array 9a have an inverted T-letter configuration. The mask patterns 10b/11b for the bit contact holes are aligned with the center portions of the mask patterns 10a/11a, and the mask patterns 10c/11c are aligned with the lateral portions of the mask patterns 10a/11a. The minimum design rule for the memory cells is 0.25 micron, and the minimum line width and the minimum space width in the mask patterns 10a/11a, 10b/11b and 10c/11c are 0.25 micron. However, the other peripheral circuits are designed under the minimum design rule of 0.3 micron or more.

When the three kinds of mask pattern are transferred to a silicon wafer by using a KrF excimer laser radiation, active areas 12a, bit contact holes 12b and node contact holes 12c are formed in the memory cell sub-arrays 8a, and active areas 13a, bit contact holes 13b and node contact holes 13c are formed in the memory cell sub-arrays 9a. The corners of the patterns are rounded.

When the fabrication process is completed, the prior art semiconductor dynamic random access memory device has the structure shown in FIGS. 3A to 3D. FIGS. 3A and 3B show the cross section taken along line A—A of FIG. 2A and the cross section taken along line B—B in FIG. 2B, and FIGS. 3C and 3D show the cross section taken along line C—C of FIG. 2A and the cross section taken along line D—D of FIG. 2B.

The prior art semiconductor dynamic random access memory device is fabricated on a p-type silicon wafer 20, and a thick field oxide layer 21 defines the active areas 12a/13a on the major surface of the p-type silicon wafer 20. The active areas 12a/13a have n-type drain regions 22a/22b and n-type source regions 23a/23b spaced form the associated n-type source regions 22a/22b, and the n-type source regions 22a/22b are merged with n-type bit line contact regions 24a/24b, respectively. Gate oxide layers 25a/25b cover the channel regions between the n-type source regions 22a/22b and tie n-type drain regions 23a/23b, and are overlain by gate electrodes 26a/26b, respectively. The gate electrodes 26a/26b form parts of word lines.

An inter-level insulating layer 27 covers the word lines, and bit lines 28a/28b extend in the inter-level insulating layer 27. The bit c contact holes 12b/13b are formed in the inter-level insulating layer 27, and are plugged with conductive pieces 29a/29b so as to electrically connect the bit lines 28a/28b through the conductive pieces 29a/29b to the n-type bit line contact regions 24a/24b. The node contact holes 12c/13c are further formed in the inter-level insulating layer 27, and are open to the n-type source regionis 23a/23b and the upper surface of the inter-level insulating layer 27. The node contact holes 12c/13c are plugged with conductive pieces 30a/30b, and the conductive pieces 30a/30b are held in contact with the n-type source regions 23a/23b.

Node electrodes 31a/31b are formed on the upper surface of the inter-level insulating layer 27, and are covered with dielectric layers 32a/32b. Counter electrodes 33a/33b are formed on the dielectric layers 32a/32b, and are opposed to the node electrodes 31a/31b.

The KrF excimer laser presently achieves the narrowest pattern. However, 0.25 micron pattern width is close to the limit of the pattern resolution, and the proximity effect seriously affects the patterns on the silicon wafer 20. The corners are rounded due to the proximity effect. For this reason, the contact holes 12b/12c/13b/13c are changed from squares to circles, and the active areas 12a/13a are changed from the T-letter configuration to an isosceles triangle configuration with rounded corners.

If the three kinds of mask pattern are exactly aligned, the bit contact holes 12b/13b and the node contact holes 12c/13c fall within the bit line contact regions 24a/24b and the n-type source regions 23a/23b, and the bit lines 28a/28b can be surely electrically connected through the active areas 12a/13a to the associated node electrodes 31a/31b. However, the mask patterns for the contact holes are unavoidably misaligned with the mask pattern for the active areas 12a/13a in an actual aligner. As a result, the bit contact holes 12b/13b and/or the node contact holes 12c/13c are offset from the active areas 12a/13a. If the mask pattern for the bit contact holes and the mask pattern for the node contact holes are offset from the mask pattern for the active areas by 0.1 micron in the longitudinal direction as indicated by arrows AR3 and AR4 in FIGS. 2A and 2B, the bit contact hole 13b and the node contact holes 12c/13c penetrates through the thick field oxide layer 21 (see FIGS. 3B, 3C and 3D), and reach the silicon wafer 20. The thick field oxide layer 21 is designed to space the adjacent active areas 13a by the minimum pattern width as indicated by MINI (see FIG. 2B). However, the node contact holes 12c/13c offset from the target portions consume the thick field oxide layer 21, and define gaps MIN2 shorter than the minimum pattern width MIN1. If the gaps MIN2 shorter than the minimum pattern width MINI take place, the thick field oxide layer 21 imperfectly isolates the memory cell from the adjacent memory cells.

If the bit contact holes 12b/13b are offset from target portions in the direction of arrow AR1 (see FIG. 1), the contact holes 13b project from the active areas 13a, and the projection is increased together with the amount of offset as indicated by plots PL1 (see FIG. 4). On the other hand, if the bit contact holes 12b/13b are offset from the target portions in the opposite direction to arrow AR1, the bit contact holes 12b project from the active areas 12a, and the projection is increased together with the amount of offset as indicated by plots PL2. Thus, when the offset is greater than 0.06 micron, the bit contact holes 12b or 13b project from the associated active areas 12a or 13a, because the layout is symmetrical with respect to the line of symmetry SY2/SY3 perpendicular to the arrow AR1.

FIG. 5 illustrates the relation between the gap MIN2 and the node contact holes 12c/13c. The gap MIN2 is varied in the memory cell sub-array 7g as indicated by plots PL3 and in the memory cell sub-array 7h as indicated by plots PL4. The gap MIN2 becomes less than the minimum pattern width PL5 in either standard or inverted pattern. Even if contact holes are also offset from target portions in the regions assigned to the peripheral circuits, the margin of alignment is so large that the contact holes are fallen within the active areas.

Thus, although the standard pattern and the inverted pattern make the layout design work easy, they decrease the margin of alignment between the active areas 12a/13a and the contact holes 12b/12c or 13b/13c, and the isolation between the active areas 12a/13a is degraded by the contact holes 12b/12c or 13b/13c projecting from the active areas 12a/13a.

SUMMARY OF THE INVENTION

It is therefore an important object of the present invention to provide a semiconductor memory device, the layout of which increases a margin of alignment of mask patterns in a predetermined direction without sacrifice of simplicity of layout design.

To accomplish the object, the present invention proposes to arrange only peripheral circuits of memory cell arrays symmetrical with one another.

In accordance with one aspect of the present invention, there is provided a semiconductor memory device fabricated on a semiconductor substrate and comprising a plurality of memory cell arrays arranged in a first direction and forming at least one pair of memory cell arrays and peripheral circuits electrically connectable to the memory cell arrays of the pair and located between one of the memory cell arrays and the other of the memory cell arrays, one of the memory cell arrays of the at least one pair includes a plurality of first memory cell sub-arrays each having first memory cells arranged in a first pattern in the first direction and a plurality of first peripheral circuits each electrically connectable to the first memory cells of the associated first memory cell sub-array and arranged in a second pattern, and the other of the memory cell arrays of the at least one pair includes a plurality of second memory cell sub-arrays each having second memory cells arranged in the first pattern in the first direction and a plurality of second peripheral circuits each electrically connectable to the second memory cells of the associated second memory cell sub-array and arranged in a third pattern symmetrical with the second pattern with respect to a second direction perpendicular to the first direction.

BRIEF DESCRIPTION OF THE DRAWINGS

The features and advantages of the semiconductor memory device will be more clearly understood from the following description taken in conjunction with the accompanying drawings in which:

FIGS. 2A and 2B are plane views showing the layouts of the memory cell sub-arrays incorporated in the prior art semiconductor dynamic random access memory device;

FIGS. 3A to 3D are cross sectional views showing the structure of the prior art semiconductor dynamic random access memory device;

DESCRIPTION OF THE PREFERRED EMBODIMENTS

First Embodiment

Figure 1:
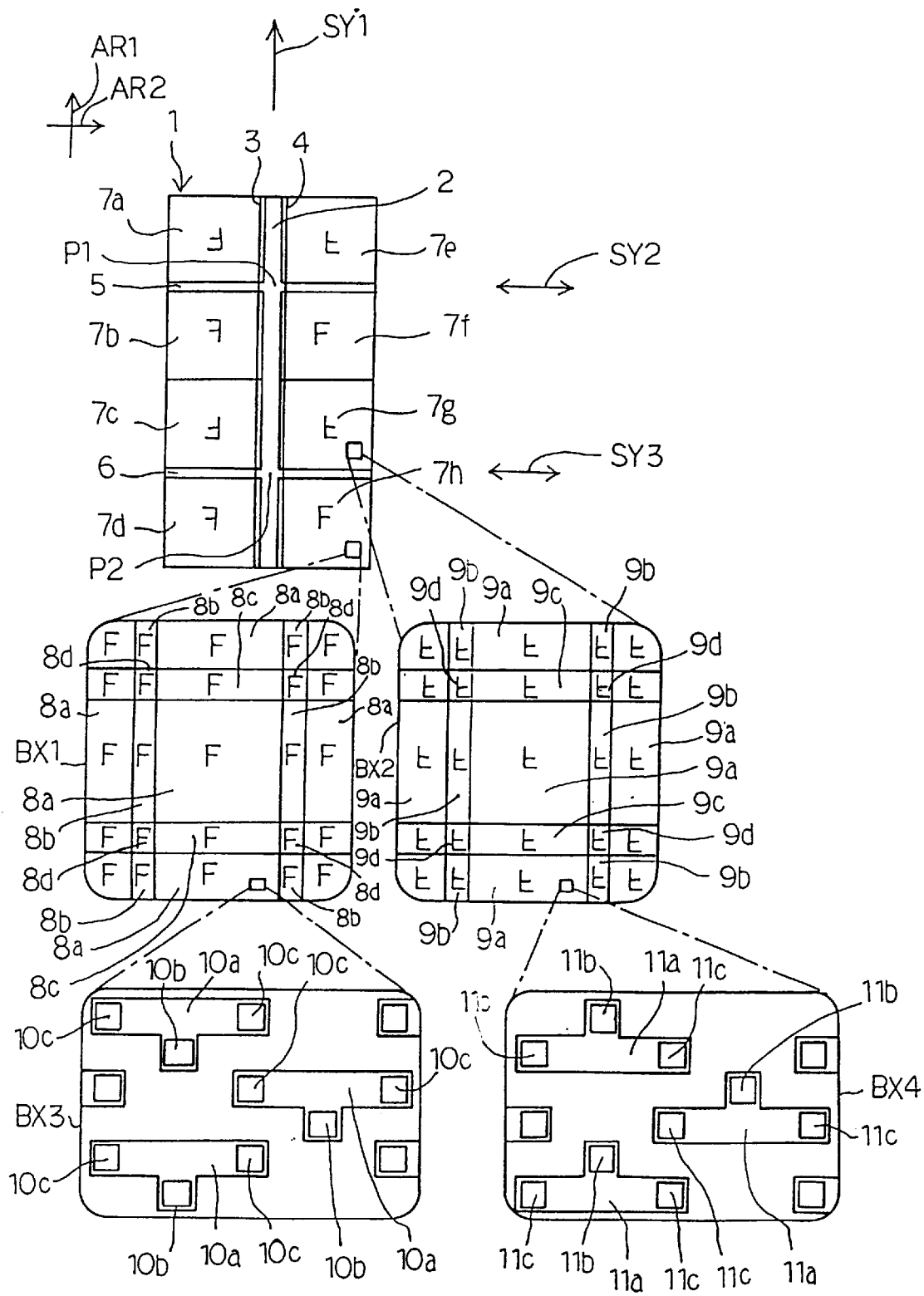
FIG. 1 is a view showing the arrangement of the semiconductor dynamic random access memory device proposed by T. Saeki et. al.
Figure 3C:
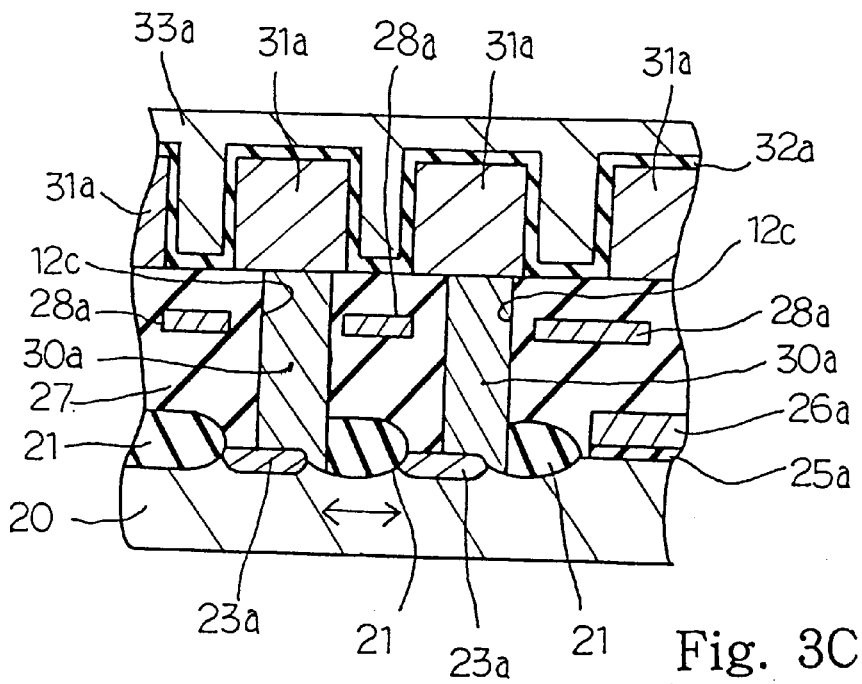
Figure 3D:
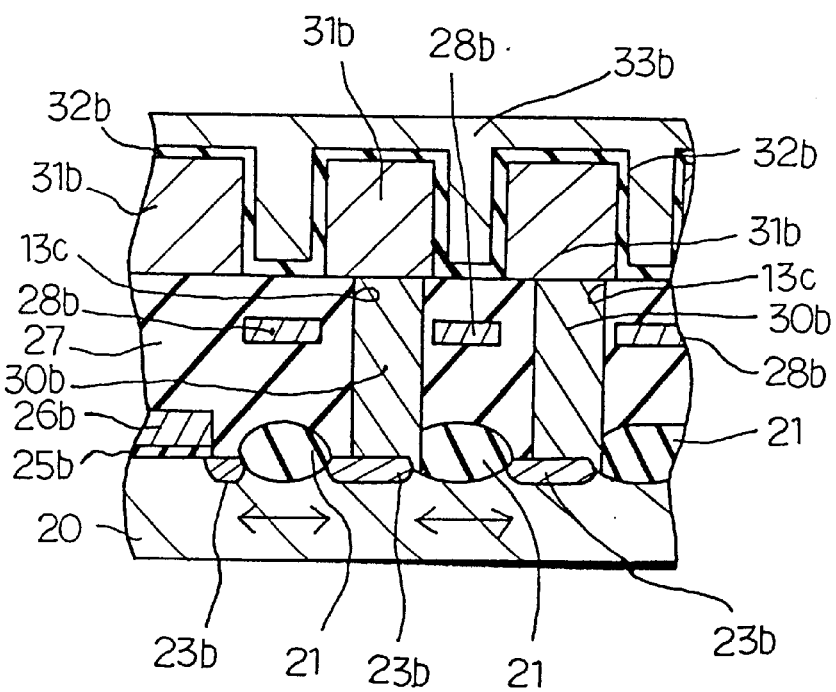
Figure 4:
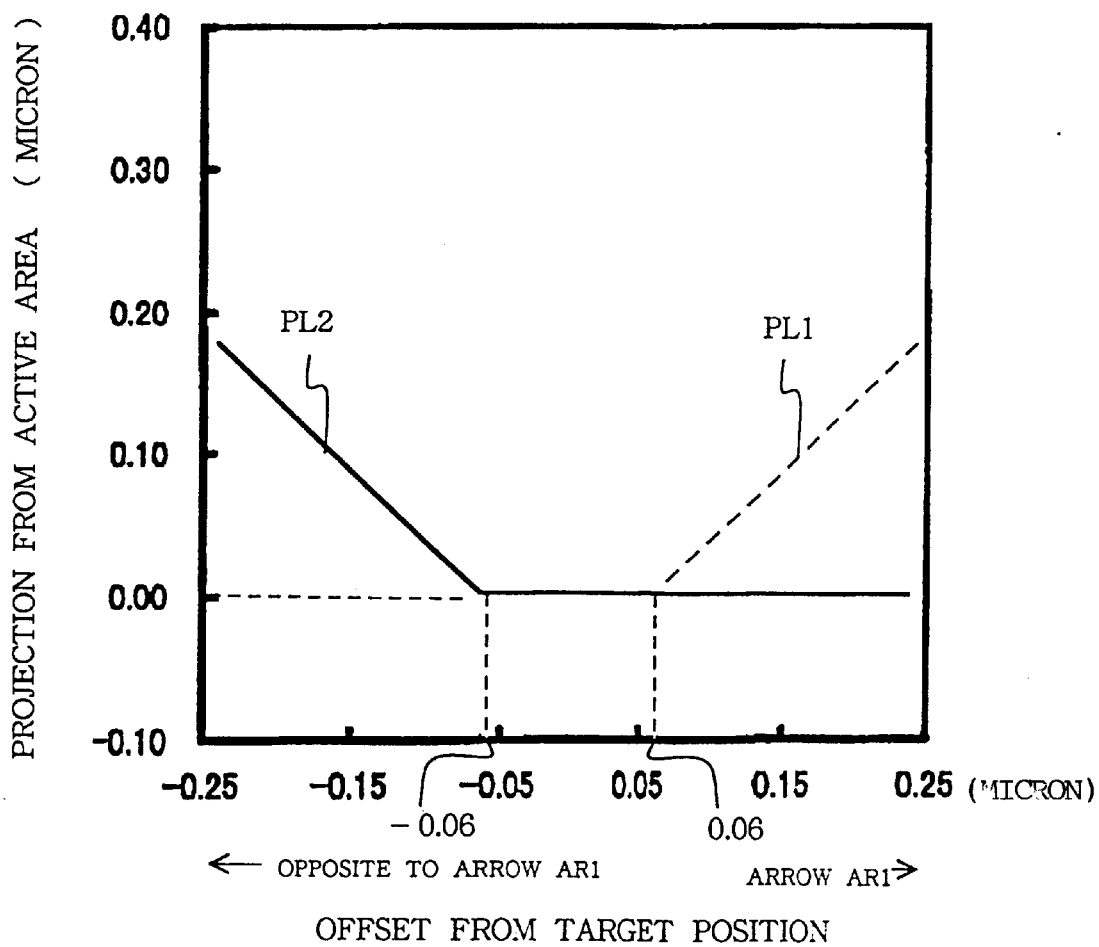
FIG. 4 is a graph showing the relation between the projection of contact holes and offset from a target position.
Figure 5:
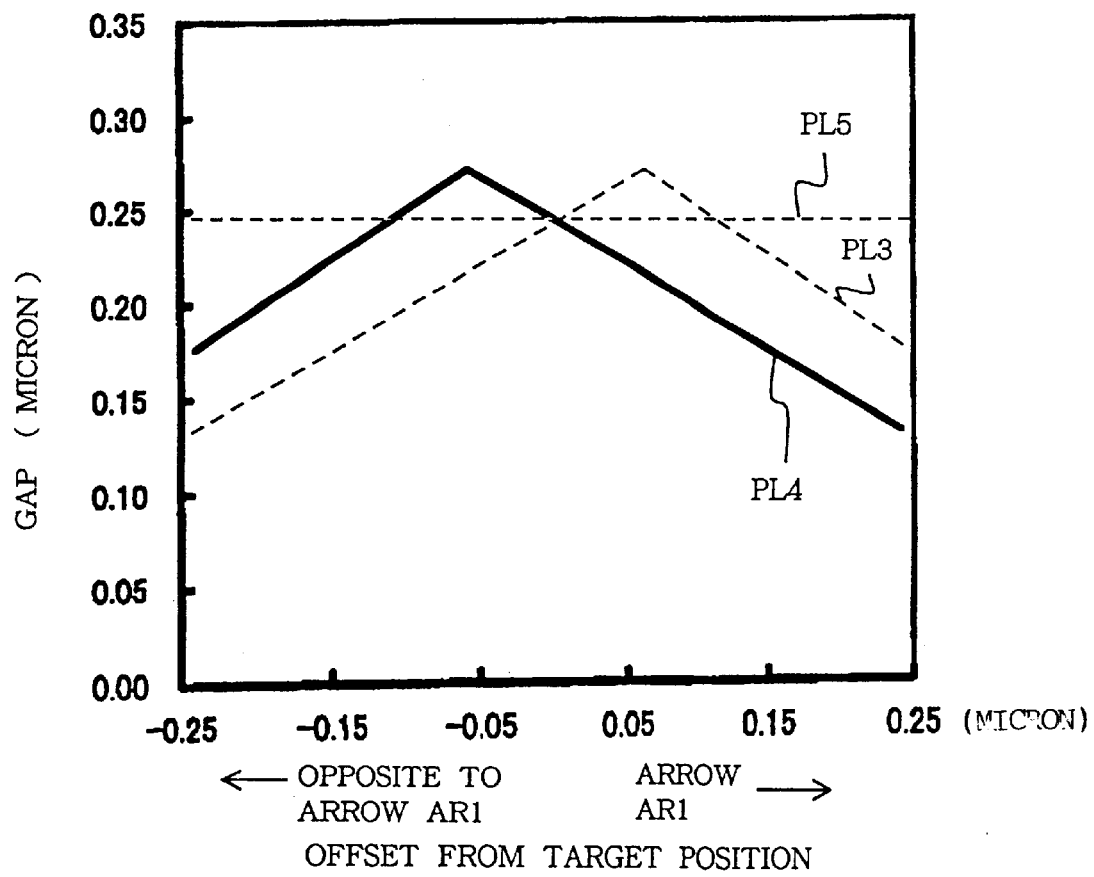
FIG. 5 is a graph showing the relation between the gap and the offset.
Figure 6:
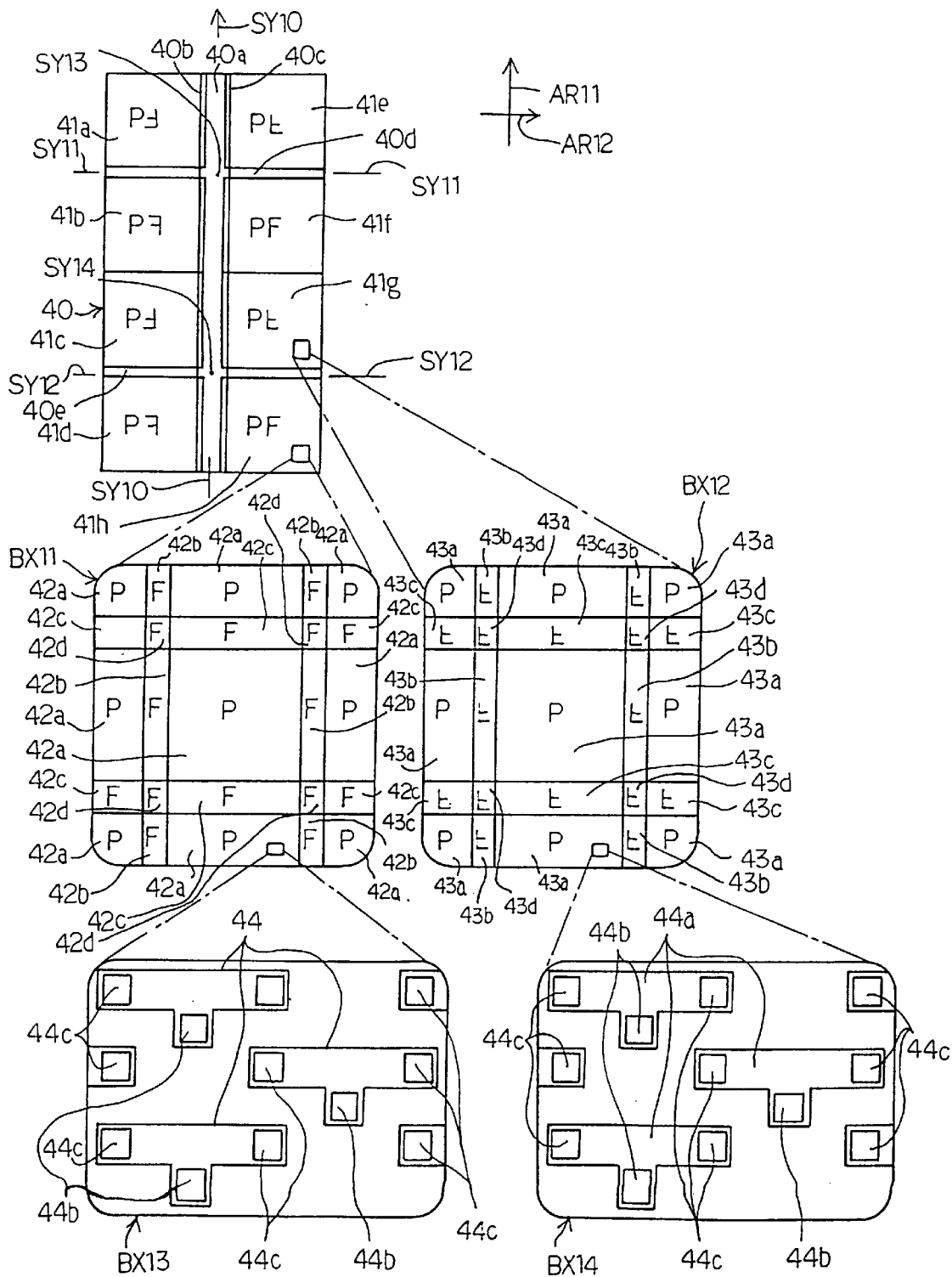
FIG. 6 is a view showing the layout of memory cell arrays and peripheral circuits of a semiconductor memory device according to the present invention.

FIG. 6 illustrates a layout of memory cell arrays and peripheral circuits of a semiconductor memory device embodying the present invention. The semiconductor device is fabricated on a semiconductor chip 40. The semiconductor chip 40 has long edges in a direction indicated by arrow AR11 and short edges in the perpendicular direction indicated by arrow AR12.

Eight memory cell arrays 41a, 41b, 41c, 41d, 41e, 41f, 41g and 41h make two lines. A narrow area 40a extends between memory cells 41a to 41d and the memory cells 41e to 41h, and input and output circuits and a controller are integrated in the narrow area 40a. Narrow areas 41b/41c further extend on both sides of the narrow area 41a in the direction of arrow ART11, and column address decoders are integrated in the narrow areas 41b/41c. The column address decoders are associated with the adjacent memory cell arrays 41a to 41h, and selectively connect bit lines (not shown in FIG. 6) to the associated input and output circuits.

The memory cell arrays 41b and 41f are contiguous to the memory cell arrays 40c and 41g, respectively, and narrow areas 40d/40e extend in the perpendicular direction indicated by arrow AR12 between the memory cell arrays 41a/41e and the memory cell arrays 41b/41f and between the memory cell arrays 41c/41g and the memory cell arrays 41d/41h. Row address decoders are integrated in the narrow areas 40d/40e, and selectively activate main word lines (not shown). The main word lines are changed to an active level so as to selectively make memory cell sub-arrays, which are described hereinbelow, selectively accessible.

Each of the memory cell arrays 41a to 41h includes a plurality of memory cell sub-arrays 42a/43a and peripheral circuits such as, for example, sense amplifier units 42b/43b and sub-word line drivers 42c/43c. Each of the memory cell sub-arrays 42a/43a is implemented by plural memory cells, which are arranged in matrix. The columns of memory cells are respectively connected to the bit lines, and the bit lines write data bits into and read out them from a selected row of memory cells. Sub-word lines are respectively connected to the rows of memory cells, and a sub-word line driver 42c/43c selectively changes the sub-word lines to an active level so as to electrically connect the associated row of memory cells to the bit lines. The sub-word line drivers 42c/43c cross the sense amplifier units 42b/43b in regions 42d/43d.

The memory cells are assumed to be arranged in each memory cell sub-arrays 42a/43a as indicated by "P", and "F" is representative of the arrangement of the peripheral circuits in each memory cell array 41a to 41h. For this reason, the arrangement of each of the memory cell arrays 41a to 41h is represented by the combination of "P" and "F". The layout in the memory cell arrays 41g/41h is enlarged in boxes BX11/BX12.

All the memory cells are directed to the same direction, and the layout of memory cells is represented by non-inverted letter "P". The memory cells are formed on a semiconductor wafer, a part of which is the semiconductor chip 40, through a photo-lithography. In this instance, the minimum pattern width, i.e., both of the minimum line width and the minimum space width are 0.25 micron, and the minimum pattern width outside of the memory cell sub-arrays 42a/43a is equal to or greater than 0.3 micron.

Various mask patterns are sequentially transferred from photo-masks (not shown) onto the semiconductor chip 40, and a mask pattern 44a for active areas, a mask pattern 44b for bit contact holes and a mask pattern 44c for node contact holes are laminated as shown in boxes BX13/BX14. A piece of mask pattern for each active area is like non-inverted T-letter, and a piece of mask pattern for each bit contact hole and a piece of mask pattern for each node contact hole are square. The mask patterns are same between the memory cell array 41h and the memory cell array 41g. Although other mask patterns are required for the memory cells, they are not show in boxes BX13/BX14 so as to make the three mask patterns clear.

On the other hand, the layout of peripheral circuits is different between the memory cell arrays 41a to 41h. The memory cell arrays 41h/42f have a standard layout of peripheral circuits represented by non-inverted letter "F". The layout of peripheral circuits in the memory cell arrays 41b/41d is symmetrical with the standard layout with respect to a line of symmetry SY10, and the layout of peripheral circuits in the memory cell array 41e/41g is symmetrical with the standard layout with respect to a line of symmetry SY11/SY12. On the other hand, the layout of peripheral circuits in the memory cell array 41a/41c is symmetrical with the standard layout with respect to a point of symmetry SY13/SY14. Thus, the pattern "F" of peripheral circuits is repeatedly used for the memory cell arrays 41a to 41h. A CAD system makes the design work simple, and allows a designer to easily modify a part of the layout. A connection between the memory cell sub-array 42a/43a and the peripheral circuits is rather simple, and the employment of the standard layout "P" does not make the design work complicated.

Figure 7:
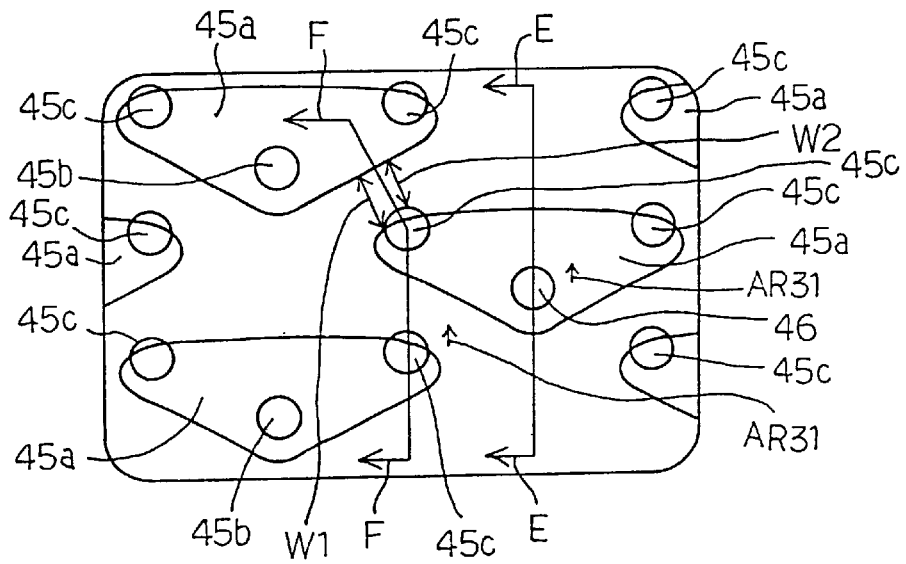
FIG. 7 is a plane view showing the layout of memory cells incorporated in the semiconductor memory device.

A KrF excimer laser aligner sequentially transfers the mask patterns shown in boxes BX13/BX14 to photo-sensitive layers on the semiconductor chip 40, and form active layers 45a, bit contact holes 45b and node contact holes 45c as shown in FIG. 7.

Figure 8A:
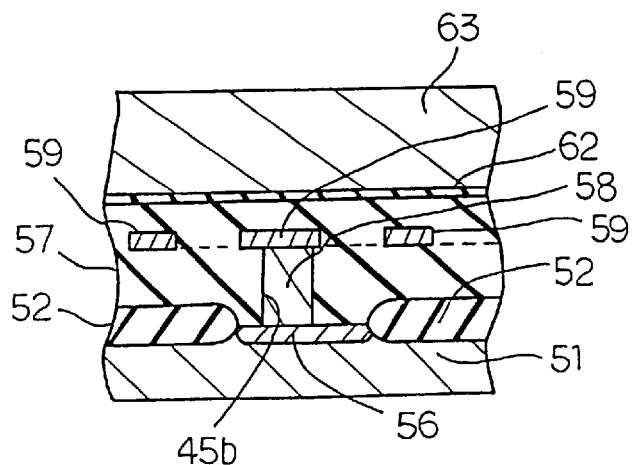
FIG. 8A is a cross sectional view taken along line E—E of FIG. 7 and showing the structure of the semiconductor memory device.
Figure 8B:
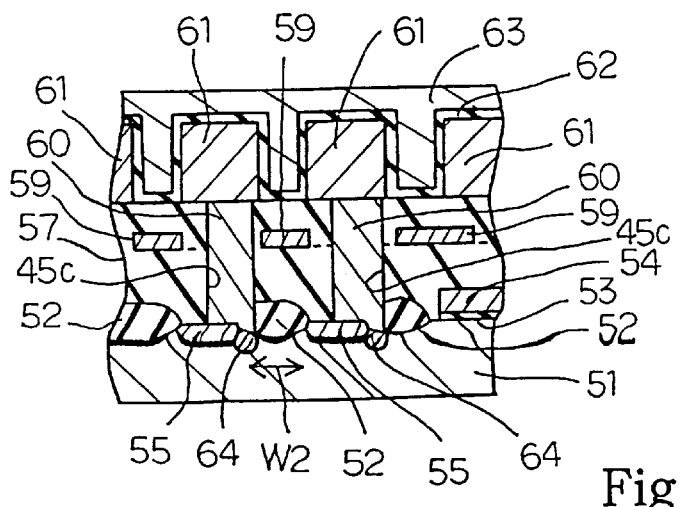
FIG. 8B is a cross sectional view taken along line F—F of FIG. 7, and showing the structure of the semiconductor memory device.

A process of fabricating the semiconductor memory device is briefly described hereinbelow, and FIGS. 8A and 8B illustrate the structure of the semiconductor memory device. The process starts with preparation of a semiconductor wafer 51. The mask pattern 44a is transferred to a photo-resist layer (not shown) spread over the semiconductor wafer 51 through KrF excimer laser radiation, and a thick field insulating layer 52 is selectively grown on the major surface of the semiconductor wafer 51. The thick field insulating layer 52 defines the active areas 45a, and the active area 45 has an isosceles triangle configuration with rounded corners due to the proximity effect.

Thin gate insulating layers 53 are grown on the active areas, and conductive material such as polycrystalline silicon is grown over the entire surface of the resultant semiconductor structure. The polycrystalline silicon layer is patterned into sub-word lines 54 by using the lithographic techniques and an etching. The sub-word lines 54 extend on the gate insulating layers 53. Side wall spacers may be formed on both sides of the word lines 54.

Using, the word lines 54 as an ion-implantation mask, n-type dopant impurity is ion implanted into the active areas 45a, and forms n-type source regions 55 and n-type drain/bit contact regions 56. A lower insulating layer of an inter-layer insulating structure 57 is deposited over the entire surface of the resultant semiconductor structure, and a photo-resist layer is spread over the lower insulating layer. The mask pattern 44b is transferred from the photo mask to the photo-resist layer, and is formed into a photo-resist etching mask. Using the photo-resist etching mask, the lower insulating layer is selectively etched away so as to form the bit contact holes 45b. The bit contact holes 45b is rounded due to the proximity effect during the optical pattern transfer. The bit contact holes 45b is plugged with conductive pieces 58.

Conductive material is deposited over the upper surface of the lower insulating layer of the inter-layer insulating structure 57, and a photo-resist etching mask (not shown) is patterned on the conductive material layer. The conductive material layer is selectively etched away, and is patterned into bit lines 59. The bit lines 59 a re selectively connected through the conductive pieces 58 to the n-type drain/bit contact regions 56.

An upper insulating layer of the inter-layer insulating structure e 57 is deposited over the entire surface of the resultant semiconductor structure, and a photo-resist layer is spread over the upper surface of the upper insulating layer. The mask pattern 44c is transferred through KrF excimer laser light to the photo-resist layer, and a photo-resist etching mask is formed on the upper insulating layer. Using the photo-resist etching mask, the upper insulating layer and the lower insulating layer are selectively etched away, and node contact holes 45c are formed in the inter-layer insulating structure 57. The node contact holes 45c have a circular cross section due to the proximity effect during the pattern transfer. The node contact holes 45c are plugged with conductive pieces 60.

Conductive material is deposited over the entire surface of the resultant semiconductor structure, and the conductive material layer is patterned into node electrodes 61. The node electrodes 61 are connected through the conductive pieces 60 to the n-type source regions 55. The node electrodes 61 are covered with a dielectric layer 62, and counter electrodes 63 are opposed to the dielectric layer 62.

If the photo-masks for the contact holes 45b/45c are perfectly aligned, the bit contact holes 45b and the node contact holes 45c are surely fallen within the active areas 45a, and the thick field insulating layer 52 has the minimum pattern width W1 between the adjacent active areas 45a. However, misalignment is unavoidable. When the photo-masks for the contact holes 45b/45c are offset in the direction of arrow AR31 by 0.1 micron, the bit contact holes 45b are still within the active areas 45a (see FIG. 8A), and the node contact holes 45c partially project from the active areas 45a as shown in FIGS. 7 and 8B. The node contact holes 45c pass through the thick field insulating layer 52. In order to prevent the conductive pieces 60 from direct contact with the p-type semiconductor wafer 51, additional n-type source regions 64 are formed under the periphery of the thick field insulating layer 52. The additional n-type source regions 64 are formed through an ion-implantation or a diffusion from the conductive pieces 60.

Figure 9:
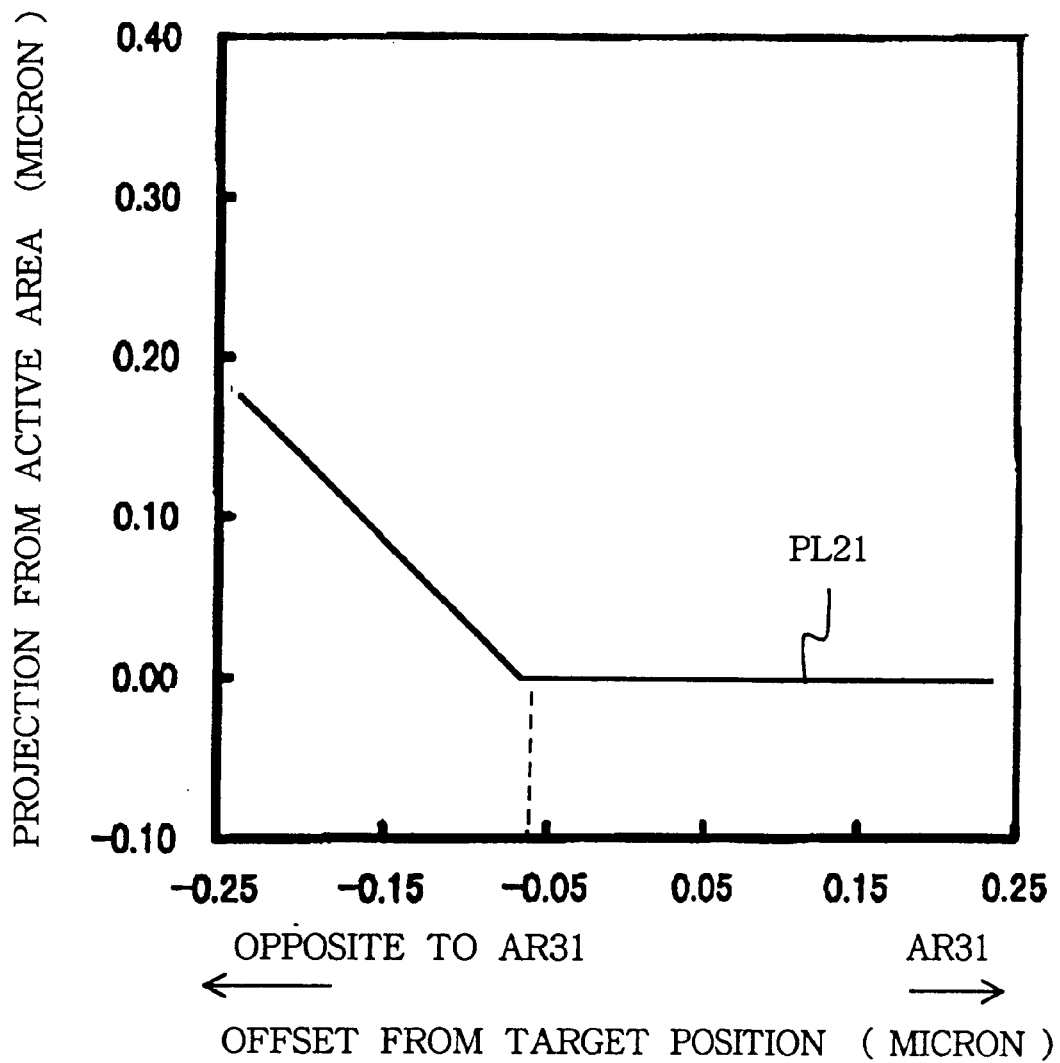
FIG. 9 is a graph showing relation between a projection of a bit contact hole from an active area and offset from a target position.

The conductive pieces 60 are spaced from the adjacent active areas 45a by distance W2 shorter than the minimum pattern width W1. If the distance W2 is too short, it becomes impossible to electrically isolate the component elements from one another. FIG. 9 illustrates the relation between the offset of the bit contact holes 45b from target positions and projection of the bit contact holes 45b from the active areas 45a. If the bit contact holes 45b are offset from the target positions by at least 0.06 micron in the opposite direction to arrow AR31, the bit contact holes 45b project into the thick field insulating layer 52. However, even if the bit contact holes 45b are offset from the target positions by less than 0.25 micron in the direction of arrow AR31, any bit contact hole 45b never projects from the active area 45a, and all the bit contact holes 45b are fallen within the active areas 45a, because all the memory cell sub-arrays have the non-inverted pattern "P". Thus, the relation between the offset and the projection is indicated by plots PL21.

Figure 10:
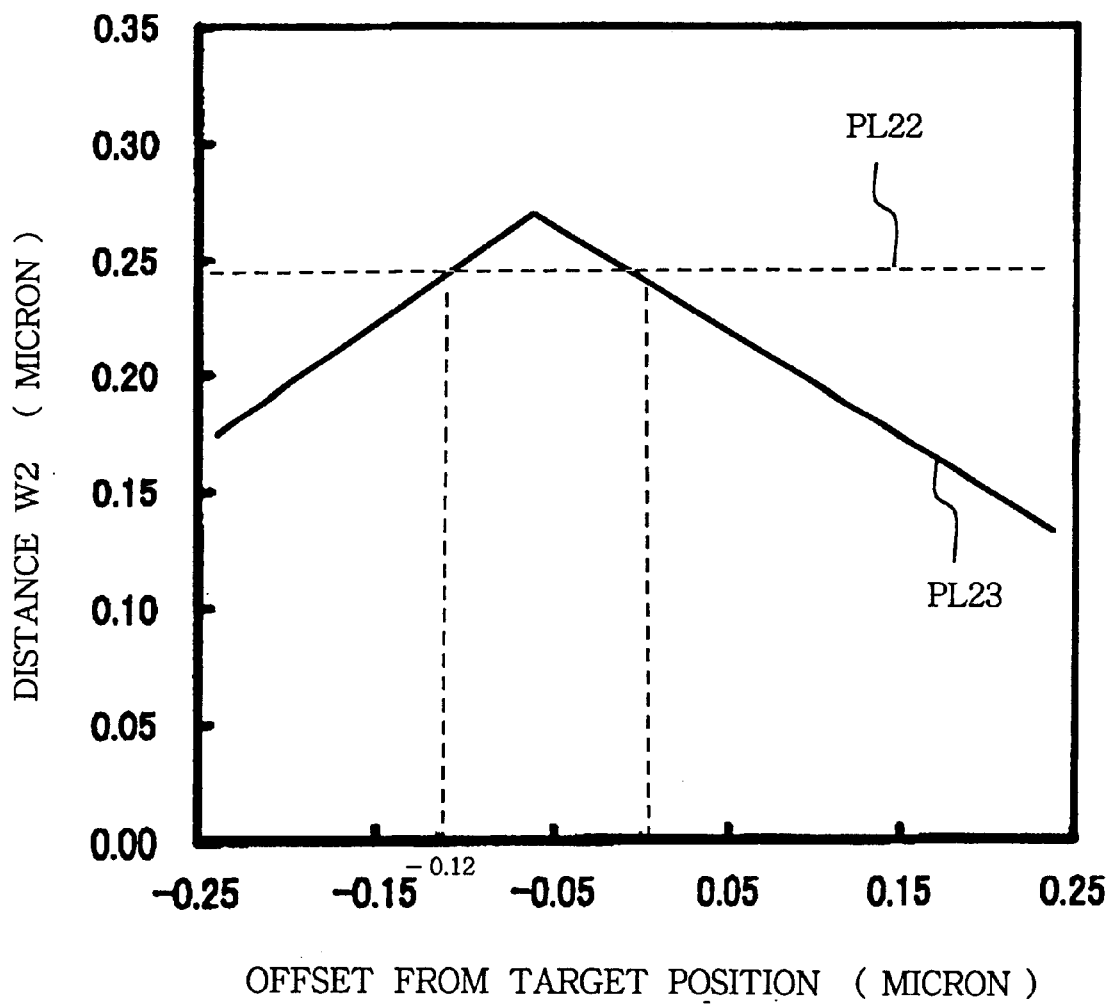
FIG. 10 is a graph showing relation between the minimum gap and offset of a node contact hole from a target portion.

FIG. 10 illustrates influence of the offset on the node contact holes 45c. The minimum pattern width W1 is 0.25 micron as indicated by plots PL22. When the node contact holes 45c are offset from target portions in the direction of arrow AR31, the node contact holes 45c immediately makes the distance W2 less than the minimum pattern width WI as indicated by plots PL23. However, when the node contact holes 45c are offset in the opposite direction to arrow AR31, the node contact holes 45c does not project from the active areas 45a until 0.12 micron, and, accordingly, the distance W2 is greater than the minimum pattern width W1. Thus, the layout of the memory cell arrays "P" increases the margin of alignment in the opposite direction to arrow AR31.

Second Embodiment

Figure 11:
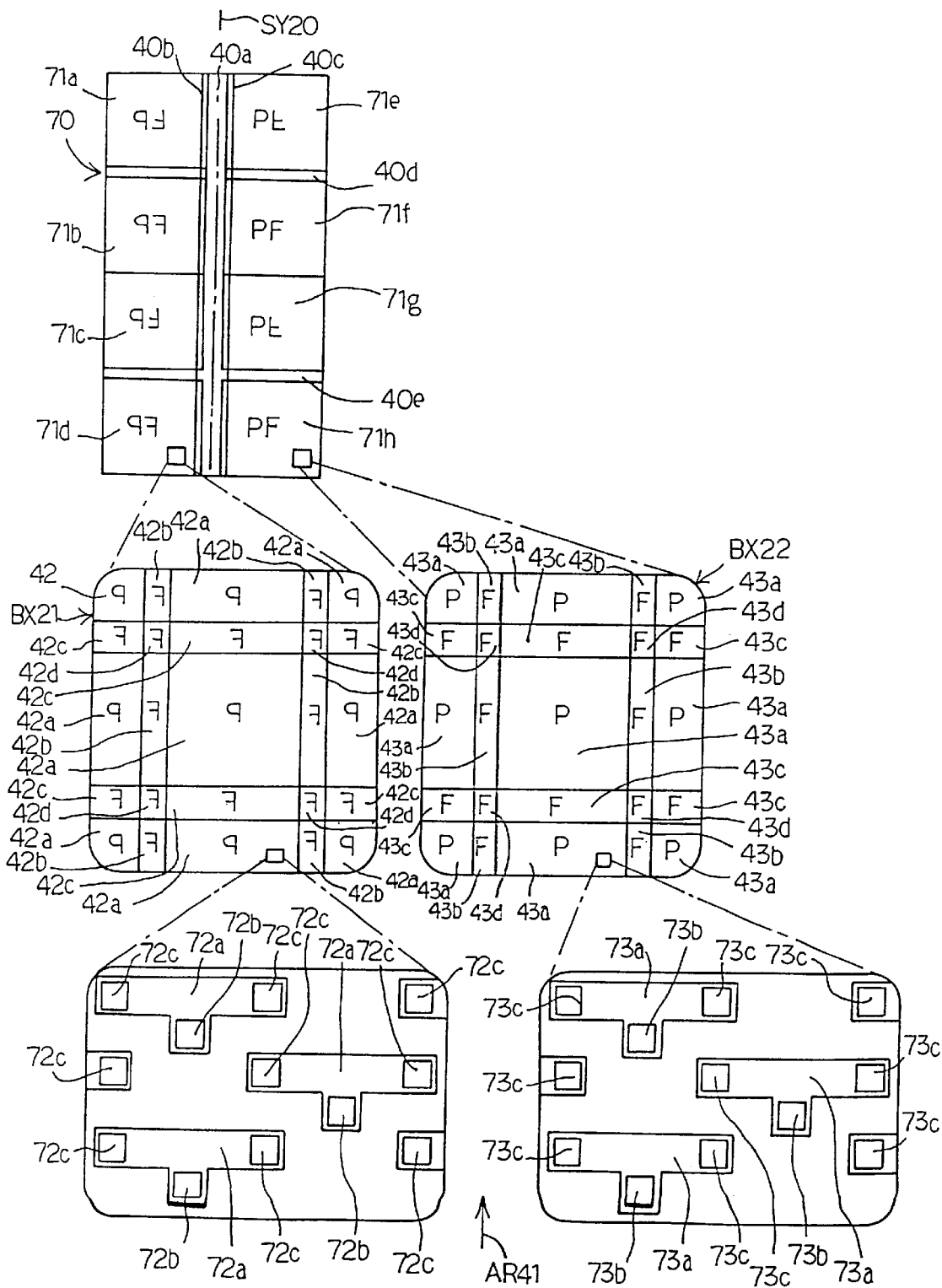
FIG. 11 is a view showing the layout of memory cell arrays and peripheral circuits of another semiconductor memory device according to the present invention.

Turning to FIG. 11 of the drawings, another semiconductor dynamic random access memory device is fabricated on a semiconductor chip 70, and eight memory cell arrays 71a, 71b, 71c, 71d, 71e, 71f, 71g and 71h are arranged in two lines. Row address decoders, input/output circuits, controllers and column address decoders are arranged as similar to those of the first embodiment, and are labeled with the same references as those of the first embodiment.

The second embodiment is different from the first embodiment in the layout of memory cells "P". In detail, each of the memory cell arrays 71a to 71h has plural memory cell sub-arrays and peripheral circuits. The memory cell sub-arrays and the peripheral circuits are labeled with the same references as those of the first embodiment in the boxes BX21/BX22. The layout of the peripheral circuits is represented by "F", and the layout of the memory cells is represented by "P". The combination of "F" and "P" represents the layout of each memory cell array 41a to 41h. The minimum pattern width is 0.25 micron in the memory cell sub-arrays, and is equal to or greater than 0.3 micron in the other area.

Comparing FIG. 11 with FIG. 6, the peripheral circuits are layouted in the memory cell arrays 71a to 71h in a similar manner to the peripheral circuits in the memory cell arrays 41a to 41h. The memory cell arrays 71e to 71h have the standard layout represented by non-inverted letter "P". However, the memory cells in the memory cell arrays 71a to 71d are layouted in a symmnetrical manner with the memory cells in the arrays 71e to 71h with respect to a line of symmetry SY20. For this reason, the layout of memory cells is represented by mirror image of letter "P".

Since the layout of memory cells is mirrored between the arrays 71a to 71d and the arrays 71e to 71h, the mask patterns 72a/73a, 72b/73b and 72c/73c are used for active areas, bit contact holes and node contact holes, respectively. The mask pattern for the active areas has photo-transmitting portions 72a/73a of generally T-letter configurations. For this reason, even though the photo-transmitting portions 72a are symmetrical with the photo-transmitting portions 73a, the margin of alignment is increased. In the first embodiment, the offset is allowed in one direction. The allowed offset is dependent on the location of the pattern in the second embodiment.

As will be appreciated from the foregoing description, the layout of memory cell arrays "PF" increases the margin of alignment without sacrifice of the simple design work.

Although particular embodiments of the present invention have been shown and described, it will be obvious to those skilled in the art that various changes and modifications may be made without departing from the spirit and scope of the present invention. For example, the layout according to the present invention may be applied to a static random access memory device, a mask read only memory device, an electrically programmable read only memory, an electrically erasable and programmable read only memory device and a flash memory.

The layout of memory cells may be symmetrical with respect to a line of symmetry perpendicular to the line of symmetry SY20.

What is claimed is:

1. A semiconductor memory device fabricated on a semiconductor substrate, comprising:

a plurality of memory cell arrays arranged in a first direction, and forming at least one pair of first memory cell arrays, one of the memory cell arrays of said at least one pair including a plurality of first memory cell sub-arrays each having first memory cells arranged in a first pattern in said first direction and a plurality of first peripheral circuits each electrically connectable to said first memory cells of the associated first memory cell sub-array and arranged in a second pattern, and the other of said memory cell arrays of said at least one pair including a plurality of second memory cell sub-arrays each having second memory cells arranged in said first pattern in said first direction and a plurality of second peripheral circuits each electrically connectable to said second memory cells of the associated second memory cell sub-array and arranged in a third pattern symmetrical with said second pattern with respect to a second direction perpendicular to said first direction; and third peripheral circuits electrically connectable to said memory cell arrays of said at least one pair, and located between said one of said memory cell arrays and said other of said memory cell arrays.

2. The semiconductor memory device as set forth in claim 1, in which each of said plurality of first memory cell sub-arrays and each of said plurality of second memory cell sub-arrays further has first bit lines and first sub-word lines selectively associated with said first memory cells for connecting selected first memory cells to said first bit lines and second bit lines and second sub-word lines selectively associated with said second memory cells for connecting selected second memory cells to said second bit lines, first sub-word line drivers connected to said first sub-word lines and first sense amplifier units connected to said first bit lines form parts of said plurality of first peripheral circuits, and second sub-word line drivers connected to said second sub-word lines and second sense amplifier units connected to said second bit lines form parts of said plurality of second peripheral circuits.

3. The semiconductor memory device as set forth in claim 1, in which said first memory cells and said second memory cells are dynamic random access memory cells.

4. The semiconductor memory device as set forth in claim 1, in which said plurality of memory cell arrays further form another pair of memory cell arrays, and the memory cell arrays of said another pair are layouted as similar to said one of said memory cell arrays and said other of said memory cell arrays, respectively.

5. The semiconductor memory device as set forth in claim 1, further comprising a plurality of other memory cell arrays arranged in said first direction, and fourth peripheral circuits located between said plurality of memory cell arrays and said plurality of other memory cell arrays.

6. The semiconductor memory device as set forth in claim 5, in which said plurality of other memory cell arrays form another pair of memory cell arrays symmetrical with said at least one pair of memory cell arrays with respect to a first line of symmetry extending in said first direction, and in which one of the memory cell arrays of said another pair includes a plurality of third memory cell sub-arrays each having third memory cells arranged in said first pattern in said first direction and a plurality of third peripheral circuits each electrically connectable to said third memory cells of the associated third memory cell sub-array and arranged in a fourth pattern symmetrical with said second pattern with respect to said first line of symmetry, and the other of said memory cell arrays of said another pair includes a plurality of fourth memory cell sub-arrays each having fourth memory cells arranged in said first pattern in said first direction and a plurality of fourth peripheral circuits each electrically connectable to said fourth memory cells of the associated fourth memory cell sub-array and arranged in a fifth pattern symmetrical with said third pattern with respect to said first line of symmetry.

7. The semiconductor memory device as set forth in claim 6, in which said first memory cells, said second memory cells, said third memory cells and said fourth memory cells are dynamic random access memory cells, and said each of said first peripheral circuits, said second peripheral circuits, said third peripheral circuits and said fourth peripheral circuits include sense amplifiers and sub-word line drivers.

8. The semiconductor memory device as set forth in claim 7, in which said first pattern has a first configuration asymmetrical with respect to a second line of symmetry perpendicular to said first line of symmetry, a second configuration located one side of said second line of symmetry and overlapped with said first configuration and a third configuration located the other side of said second line of symmetry and overlapped with said first configuration.

9. The semiconductor memory device as set forth in claim 8, in which said first configuration, said second configuration and said third configuration are an active area for a pair of said first memory cells, a pair of said second memory cells, a pair of said third memory cells or a pair of said fourth memory cells, a bit contact hole for connecting said active area to a bit line and a pair of node contact holes for connecting said active area to node electrodes of a pair of storage capacitors.

10. The semiconductor memory device as set forth in claim 5, in which said fourth peripheral circuits include input and output circuits and controllers.

11. The semiconductor memory device as set forth in claim 5, in which said plurality of other memory cell arrays form another pair of memory cell arrays symmetrical with said at least one pair of memory cell arrays with respect to a first line of symmetry extending in said first direction, and in which one of the memory cell arrays of said another pair includes a plurality of third memory cell sub-arrays each having third memory cells arranged in a fourth pattern symmetrical with said first pattern with respect to said first line of symmetry and a plurality of third peripheral circuits each electrically connectable to said third memory cells of the associated third memory cell sub-array and arranged in a fifth pattern symmetrical with said second pattern with respect to said first line of symmetry, and the other of said memory cell arrays of said another pair includes a plurality of fourth memory cell sub-arrays each having fourth memory cells arranged in said fourth pattern and a plurality of fourth peripheral circuits each electrically connectable to said fourth memory cells of the associated fourth memory cell sub-array and arranged in a sixth pattern symmetrical with said third pattern with respect to said first line of symmetry.

12. The semiconductor memory device as set forth in claim 11, in which said first memory cells, said second memory cells, said third memory cells and said fourth memory cells are dynamic random access memory cells, and said each of said first peripheral circuits, said second peripheral circuits, said third peripheral circuits and said fourth peripheral circuits include sense amplifiers and sub-word line drivers.

13. The semiconductor memory device as set forth in claim 12, in which each of said first pattern and said fourth pattern has a first configuration asymmetrical with respect to a second line of symmetry perpendicular to said first line of symmetry, a second configuration located one side of said second line of symmetry and overlapped with said first configuration and a third configuration located the other side of said second line of symmetry and overlapped with said first configuration.

14. The semiconductor memory device as set forth in claim 13, in which said first configuration, said second configuration and said third configuration are an active area for a pair of said first memory cells, a pair of said second memory cells, a pair of said third memory cells or a pair of said fourth memory cells, a bit contact hole for connecting said active area to a bit line and a pair of node contact holes for connecting said active area to node electrodes of a pair of storage capacitors.

* * * * *